(12) United States Patent
Crocker et al.

(10) Patent No.: US 7,400,503 B2
(45) Date of Patent: Jul. 15, 2008

(54) SYSTEMS FOR LOW COST COAXIAL LIQUID COOLING

(75) Inventors: Michael T. Crocker, Portland, OR (US); Daniel P. Carter, Olympia, WA (US); Kazimierz L. Kozyra, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/828,373

(22) Filed: Jul. 26, 2007

(65) Prior Publication Data

US 2007/0263354 A1 Nov. 15, 2007

Related U.S. Application Data

(63) Continuation of application No. 11/170,492, filed on Jun. 29, 2005, now Pat. No. 7,262,967.

(51) Int. Cl.
*H05K 7/20* (2006.01)
(52) U.S. Cl. .................. 361/699; 361/697; 361/702; 165/80.4; 165/104.33
(58) Field of Classification Search ......... 361/699–702, 361/697, 711; 165/121–122, 80.4, 104.33
See application file for complete search history.

(56) References Cited

U.S. PATENT DOCUMENTS

| 2,233,031 A | 2/1941 | Price |
| 2,751,900 A | 6/1956 | Modine |
| 5,539,617 A | 7/1996 | Bochtler |
| 2004/0052663 A1 | 3/2004 | Laing et al. |
| 2005/0067150 A1 | 3/2005 | Lee et al. |

FOREIGN PATENT DOCUMENTS

EP 1 369 916 A1 12/2003

OTHER PUBLICATIONS

"PCT International Search Report of the International Searching Authority", mailed Dec. 6, 2006, for PCT/US2006/025946, 4pgs.

*Primary Examiner*—Javaid Nasri
(74) *Attorney, Agent, or Firm*—Buckley, Maschoff & Talwalkar LLC

(57) ABSTRACT

According to some embodiments, systems for low cost coaxial liquid cooling may be provided. In some embodiments, a system may comprise an axis. The system may further comprise a heat exchanger coupled to a pump, wherein the heat exchanger and the pump are oriented with respect to the axis.

12 Claims, 4 Drawing Sheets

SYSTEMS FOR LOW COST COAXIAL LIQUID COOLING

CROSS REFERENCE TO RELATED APPLICATION

This is a continuation of prior U.S. patent application Ser. No. 11/170,492, filed Jun. 29, 2005, now U.S. Pat. No. 7,262,967.

BACKGROUND

Electrical devices, such as computers, are comprised of multiple electrical components (e.g., processors, voltage regulators, and/or memory devices). Electrical components typically dissipate unused electrical energy as heat, which may damage the electrical components and/or their surroundings (e.g., other electrical components and/or structural devices such as casings, housings, and/or electrical interconnects). Various means, such as heat sinks and heat pipes, have been utilized to control and/or remove heat from electrical components and their surroundings.

As electrical devices, such as personal computer (PC) devices and even computer servers, are reduced in size however, space and cost constraints become limiting design factors. Typical heat mitigation devices, for example, take up considerable amounts of room within electrical devices and/or include expensive components. As electrical devices increase in processing speed and power, their components will generate even more heat that must be removed. Typical heat mitigation devices may not be suitable for removing adequate amounts of heat from electrical components, particularly where space and cost are concerns.

DETAILED DESCRIPTION

Figure 1:
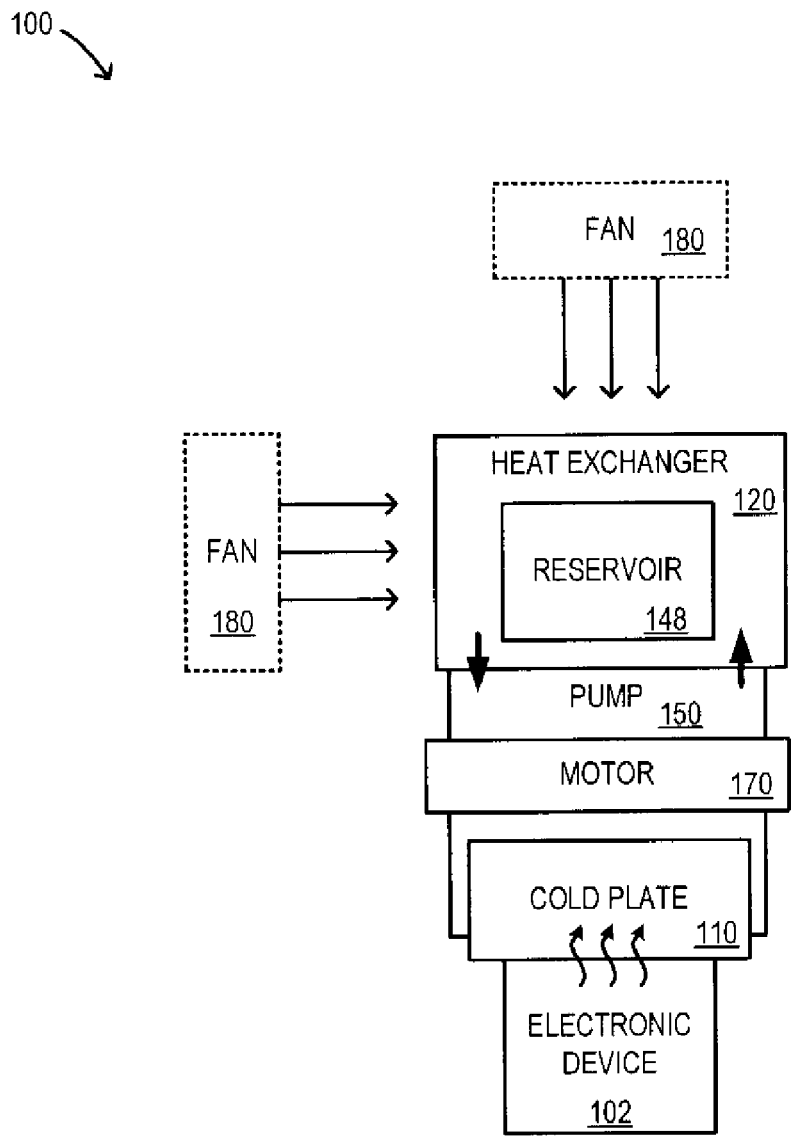
FIG. 1 is a block diagram of a system according to some embodiments.

Referring first to FIG. 1, a block diagram of a system 100 according to some embodiments is shown. The various systems described herein are depicted for use in explanation, but not limitation, of described embodiments. Different types, layouts, quantities, and configurations of any of the systems described herein may be used without deviating from the scope of some embodiments. Fewer or more components than are shown in relation to the systems described herein may be utilized without deviating from some embodiments.

The system 100 may comprise, for example, an electronic device 102 (such as a processor, memory device, a voltage regulator, etc.), a cold plate 110, a heat exchanger 120, a reservoir 148, a pump 150, a motor 170, and/or a fan 180. In some embodiments, the electronic device 102 may generate heat and/or may transfer heat to the cold plate 110. The cold plate 110 may, for example, be coupled to the electronic device 102 to accept and/or remove heat from the electronic device 102. Heat may travel through conduction, in some embodiments, from the electronic device 102 to the cold plate 110 (e.g., as depicted via the wavy lines in FIG. 1).

In some embodiments, the cold plate 110 may transfer heat to the heat exchanger 120. The heat exchanger 120 may, for example, be a heat sink and/or radiator configured to expel and/or dissipate heat. In the case that the heat exchanger 120 comprises fins (not shown in FIG. 1) for dissipating heat, for example, the fan 180 may facilitate the removal and/or dissipation of heat from the heat exchanger 120. The fan 180 may, in some embodiments, direct air toward the heat exchanger 120 (and/or any fins thereof) to facilitate forced convection to remove heat from the heat exchanger 120. In some embodiments, the fan 180 may be disposed, configured, and/or otherwise may be operable to direct air toward the heat exchanger 120 from one or more of a variety of directions. The fan 180 may, for example, be positioned to direct air toward the heat exchanger 120 in either or both of the directions depicted in FIG. 1.

The system 100 may also or alternatively comprise the pump 150. The pump 150 may, according to some embodiments, circulate a fluid within the system 100. In some embodiments, the pump 150 may comprise an impeller (not shown in FIG. 1) powered by the motor 170. For example, the heat transferred by the electronic device 102 to the cold plate 110 may be directed to and/or transferred to (e.g., conducted to) a fluid (such as water and/or propylene glycol) that circulates through and/or over the cold plate 110. The heated fluid may then, for example, be forced by the pump 150 to the heat exchanger 120 to transfer heat to the heat exchanger 120 and/or to otherwise dissipate the heat within the fluid. The heat exchanger 120 may, for example, remove heat from the fluid. The cooled fluid (e.g., cooled relative to the heated fluid and/or the cold plate 110) may then proceed to the reservoir 148. The reservoir 148 may, for example, store a quantity of the fluid for use in the system 100. The fluid may then, for example, circulate through the pump 150 (e.g., a centrifugal pump) and/or be drawn from the reservoir 148 by the pump 150. The fluid may then proceed (and/or be directed) back to the cold plate 110 to remove more heat from the cold plate 110 (e.g., by allowing heat to transfer from the cold plate 110 into the cooled fluid).

In some embodiments, the system 100 may comprise various components and/or devices not shown in FIG. 1. The heat exchanger 120 may, for example, comprise a first end and a second end, wherein the ends are disposed along an axis. According to some embodiments, the heat exchanger 120 may also or alternatively comprise a core that defines a cavity extending between the first and second ends. The heat exchanger 120 may also comprise, for example, a plurality of fins extending outwardly from the core (e.g., between the first and second ends), an inlet to accept the fluid (e.g., from the pump 150), an outlet to evacuate the fluid along the axis at the first end (e.g., to evacuate the fluid to the pump 150 and/or reservoir 148), and/or a shaped element disposed within the cavity of the core, wherein the shaped element is to direct the fluid within the cavity.

Similarly, the pump 150 may comprise, for example, a housing defining an inlet to receive the fluid (e.g., from the outlet of the heat exchanger 120), and/or an outlet to evacuate the fluid (e.g., to the inlet of the heat exchanger 120). According to some embodiments, the impeller of the pump (also not shown in FIG. 1) may rotate and/or spin about the axis to direct the fluid toward the pump outlet. According to some embodiments, the cold plate 110 may also or alternatively be at least partially disposed within the housing of the pump 150. The motor 170 may also or alternatively comprise components disposed within the housing of the pump 150 and/or outside of (i.e., external to) the housing of the pump 150.

In some embodiments, any or all of the components 102, 110, 120, 148, 150, 170, 180 of the system 100 may be oriented and/or configured to save space and/or to increase efficiency. As shown in FIG. 1, for example, the processor 102, the cold plate 110, the heat exchanger 120, the reservoir 148, the pump 150, the motor 170, and/or the fan 180 may be oriented coaxially and/or inline. In other words, the heat exchanger 120 may be oriented along the axis (e.g., the first and second ends of the heat exchanger 120 may be disposed along the axis) and/or the impeller of the pump 150 may be disposed to spin about the axis. According to some embodiments, the housing of the pump 150 and/or the cold plate 110 may also or alternatively be disposed along and/or centered upon the axis. Arranging and/or coupling some or all of the components 102, 110, 120, 148, 150, 170, 180 inline and/or otherwise in a substantially linear fashion may, for example, reduce the length of the fluid travel path within the system 100, reduce the space occupied and/or required by the system 100, reduce the number of dynamic and/or other fluid seals required in the system 100, and/or may otherwise provide advantages over previous cooling solution systems.

Figure 2A:
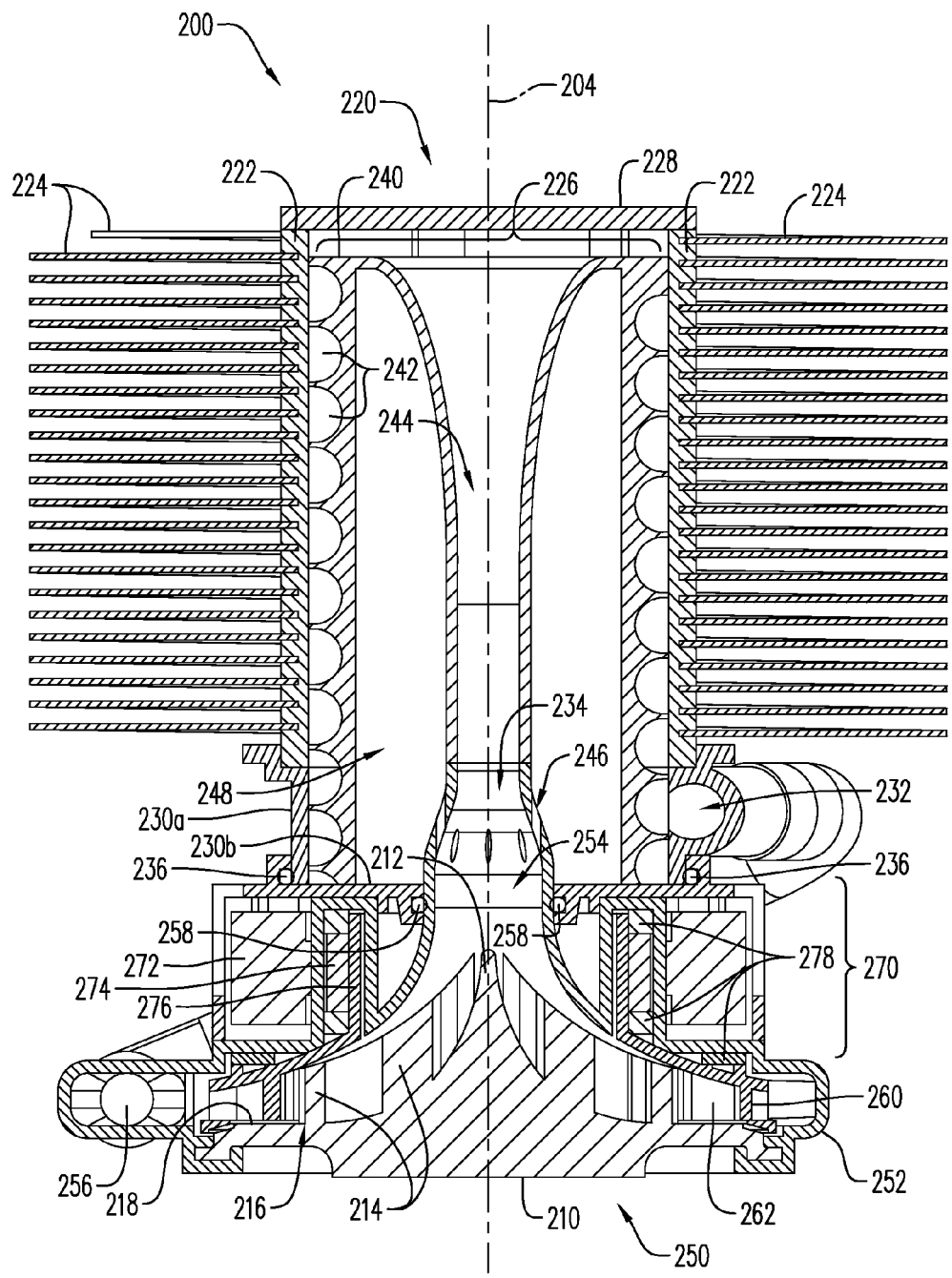
FIG. 2A is a cross-sectional diagram of a system according to some embodiments.
Figure 2B:
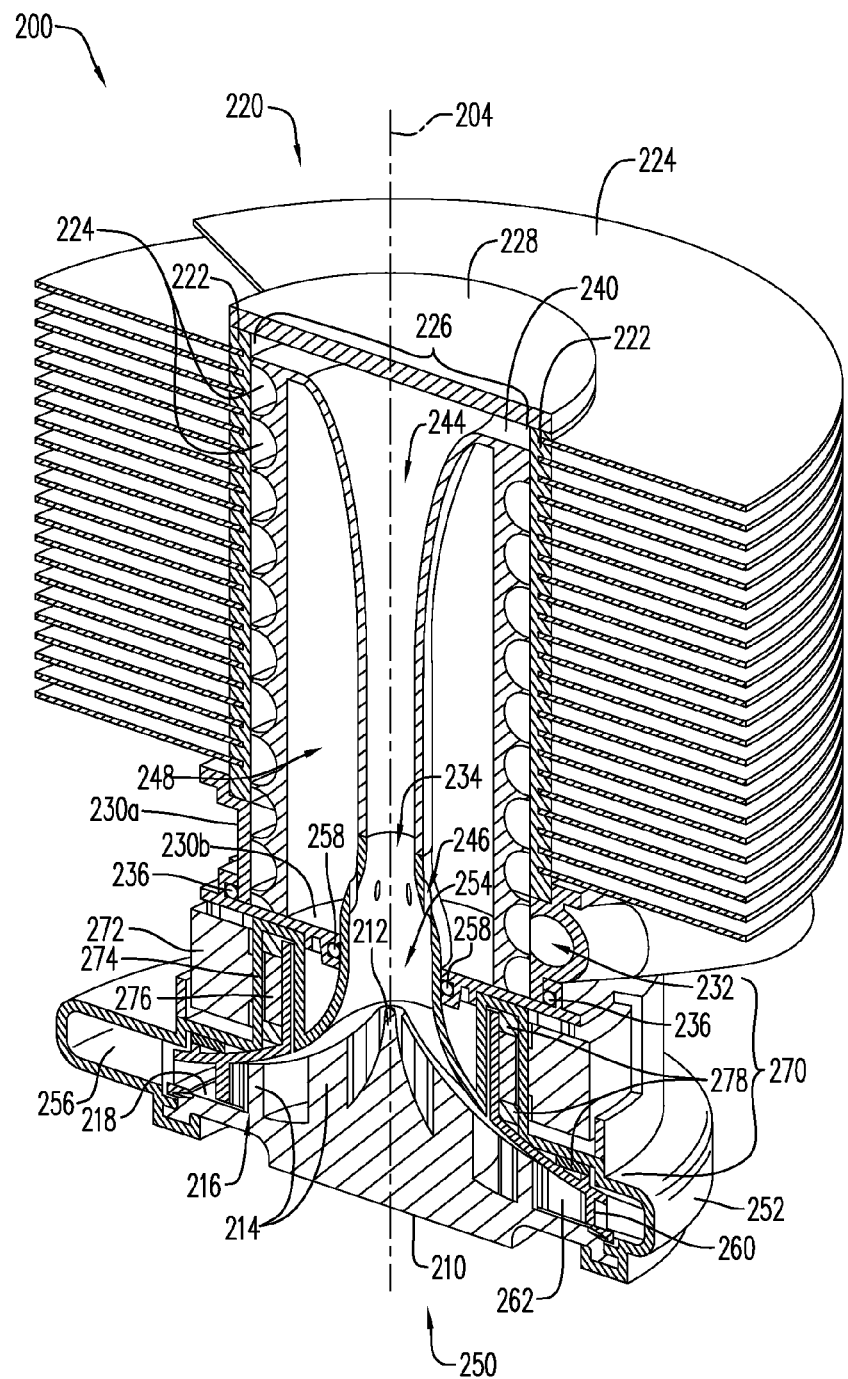
FIG. 2B is a perspective cross-sectional diagram of a system according to some embodiments.

Turning to FIG. 2A and FIG. 2B, a cross-sectional diagram of a system 200 and a perspective cross-sectional diagram of the system 200 according to some embodiments are shown, respectively. In some embodiments, the system 200 may be similar to the system 100 described in conjunction with FIG. 1. The system 200 may, for example, be configured to remove, transfer, and/or dissipate (e.g., radiate) heat. In some embodiments, fewer or more components than are shown in FIG. 2 may be included in the system 200. In some embodiments, the system 200 may define an axis 204. Various components of the system 200 may, for example, be oriented and/or configured in relation to and/or along the axis 204.

In some embodiments, the system 200 may comprise a cold plate 210. The cold plate 210 may, for example, comprise a center portion 212, fins 214, a radius 216, and/or a surface 218. The cold plate 210 may, according to some embodiments, be or include a disk and/or other circular configuration. As shown in FIG. 2A and FIG. 2B, for example, the cold plate 210 may be a finned-disk (e.g., comprising the fins 214). In some embodiments, the cold plate 210 may be comprised of copper and/or another thermally conductive material. The cold plate 210 may, for example, be a finned copper disk. According to some embodiments, the cold plate 210 may be manufactured using a metal injection molding (MIM) process or various forging techniques. In some embodiments, the cold plate 210 may be centered on and/or otherwise aligned with the axis 204. The axis 204 may, for example, pass through the center (and/or center portion 212) of the cold plate 210 in the case that the cold plate 210 is substantially circularly and/or otherwise substantially symmetrically-shaped. According to some embodiments, the cold plate 210 may comprise a plurality of cold plates (e.g., to remove heat from a plurality of electronic devices).

According to some embodiments, the cold plate 210 may be or include an integrated heat spreader (IHS) coupled to an electronic device and/or electrical component (not shown in FIG. 2A or FIG. 2B). The cold plate 210 may, for example, receive heat from the electronic device (e.g., coupled to the underside of the cold plate 210). According to some embodiments, adhesive and/or thermal grease and/or other thermal interface material may be applied between the electronic device and the cold plate 210 to facilitate heat transfer and/or coupling. In some embodiments, a fluid may also or alternatively be passed over and/or through the cold plate 210 to remove heat from the cold plate 210.

In some embodiments, the central portion 212 of the cold plate 210 may be the hottest portion of the cold plate 210 (e.g., the temperature of the cold plate 210 may decrease as the radius increases). This may be due at least in part, for example, to the concentration of heat from the electronic device toward the central portion 212 of the cold plate 210. The fins 214 of the cold plate 210 may, according to some embodiments, be configured to efficiently remove and/or dissipate heat from the cold plate 210. The fins 214 may, as shown for example, be taller near the central portion 212 of the cold plate 210 and decrease in height, size, and/or surface area as the radius of the cold plate 210 increases. The fins 214 may also or alternatively increase in number as the radius of the cold plate 210 increases. The number and/or size of the fins 214 may be designed and/or controlled, according to some embodiments, to manage the cross-sectional area of the cold plate 210 as a function of the radius of the cold plate 210. The ratio may be maintained at a substantially constant value, for example, to increase the efficiency with which the cold plate 210 may transfer heat to the fluid.

According to some embodiments, the system 200 may also or alternatively comprise a heat exchanger 220. The heat exchanger 220 may, for example, comprise a core 222. In some embodiments, the core 222 may comprise a first end and a second end (not explicitly shown in FIG. 2A or FIG. 2B), wherein the ends are disposed along the axis 204. In some embodiments, the heat exchanger 220 may comprise one or more fins 224 extending outwardly from the core 222. The fins 224 may, for example, be configured to dissipate and/or conduct heat from the core 222. In some embodiments, the fins 224 may extend outwardly from the core 222. The fins 224 may be any configuration and/or type of heat-dissipating and/or radiating features that are or become known or practicable. In some embodiments, the fins 224 may be radial curved fin (RCF) protrusions from the core 222. The fins 224 may be configured, according to some embodiments, to place a substantial percentage or all of the surface area of the fins 224 within the highest speed of airflow directed from one or more fans (not shown in FIG. 2A or FIG. 2B). The fins 224 may also, for example, be curved to capture the swirl component of any air directed by a fan toward the fins 224. The combination of the core 222 and the fins 224 may, according to some embodiments, comprise a single extrusion and/or other element. The core 222 and the fins 224 may, for example, comprise a low-cost aluminum hollow form extrusion.

The core 222 may, according to some embodiments, define the cavity 226. The cavity 226 may, for example, be a cylindrical void disposed within the cylindrically-shaped core 222. According to some embodiments, the cavity 226 may extend between the first and second points along the axis 204. In some embodiments, the cavity 226 may reduce the weight and/or cost of the heat exchanger 220. Typical heat exchangers, for example, may include solid cores that are expensive and/or substantially increase the weight of typical cooling solutions. The heat exchanger 220 in FIG. 2A and FIG. 2B, however, may be lighter and/or cheaper to produce than typical heat exchangers. At least by utilizing a fluid to transfer heat to the core 222, for example, the hollow core 222 may be lighter and/or require substantially less material (e.g., aluminum and/or other metals) than typical heat exchangers. The use of the fluid to transfer heat to the core 222 may also or alternatively allow the diameter of the core 222 to be larger than in typical heat exchangers, which in turn allows the surface area of the core 222 and the fins 224 to be larger, increasing the efficiency of heat transfer from the heat exchanger 220. In some embodiments, the core 222 and/or the cavity 226 may be aligned with the axis 204. In the case that the core 222 and/or the cavity 226 are cylindrical in shape, for example, the axis 204 may extend through the center of the core 222 and/or the cavity 226 (e.g., from one end of the cylindrical shape to the other and/or between the first and second ends of the core 222).

According to some embodiments, the heat exchanger 220 may accept heat from within the cavity 226 of the core 222. The fluid from the cold plate 210 may be circulated within the cavity 226, for example, to transfer and/or conduct heat to the heat exchanger 220. In some embodiments, the heat exchanger 220 may comprise a first end cap 228 coupled to the core 222 to retain the fluid within the cavity 226 (e.g., at and/or near the first end of the core 222). According to some embodiments, a hydraulic and/or hermetic seal may be formed between the core 222 and the first end cap 228. In such a manner, for example, fluid circulating within the cavity 226 of the core 222 may be substantially prohibited from leaking from the heat exchanger 220 and/or air may be substantially prevented from entering the fluid flow within the cavity 226 (e.g., from outside of the heat exchanger 220).

In some embodiments, the heat exchanger 220 may also or alternatively comprise a second end cap 230 (e.g., at and/or near the second end of the core 222). The second end cap 230 may, for example, be coupled to the core 222 to substantially prevent the fluid from leaking from the heat exchanger 220 (and/or to substantially prevent air from entering the cavity 226). In some embodiments, the second end cap 230 may be configured to provide, receive, evacuate, and/or otherwise transport the fluid. For example, a first portion of the second end cap 230a may comprise an inlet 232 and/or a second portion of the second end cap 230b maybe associated with an outlet 234. The inlet 232 and/or the outlet 234 may, according to some embodiments, be or include a fluid path (e.g., a conduit and/or a channel) to accept and/or evacuate the fluid, respectively.

The fluid may be accepted via the inlet 232, for example, in a heated state, be cooled by the heat exchanger 220 (i.e., it may transfer heat to the heat exchanger 220), and be evacuated via the outlet 234 in a cooled state. In some embodiments, the inlet 232 and/or the outlet 234 may be configured and/or oriented any manner that is or becomes known or practicable. As shown in FIG. 2A and FIG. 2B, for example, the inlet 232 and/or the outlet 234 may be configured to transport the fluid to and/or from particular and/or specific areas within the cavity 226 of the core 222. The outlet 234 may, for example, be disposed to evacuate the fluid substantially along the axis 204 and/or may be configured to evacuate the fluid at and/or near the second end of the core 222. In some embodiments, the portions of the second end cap 230a-b may be integrated into and/or form a single portion and/or component. In the case that the portions of the second end cap 230a-b are separate and/or removably coupled components, a seal 236 (such as an O-ring) may exist between the portions 230a-b to prevent fluid from escaping the heat exchanger 220. The seal 236 may also or alternatively be associated with an adhesive, a molding, a binding, a fit (e.g., an interference fit), and/or any other type of seal and/or sealing technique that is or becomes known or practicable.

In some embodiments, the coupling of the first end cap 228 and/or the second end cap 230 (and/or the first portion 230a thereof) to the core 222 may be conducted in any manner that is or becomes known or practicable. For example, any type or configuration of seal (not explicitly shown) that is or becomes known may be utilized to facilitate the creation of a hydraulic and/or hermetic seal between the core 222 and the end caps 228, 230. In some embodiments, the end caps 228, 230 may be configured to accept and/or receive seal material to provide an improved seal. The end caps 228, 230 may, for example, comprise any number of grooves, detents, threads, lips, seats, and/or other features that facilitate coupling to the core 222 and/or creation of a hydraulic and/or hermetic seal (e.g., to substantially prevent fluid from leaking from the cavity 226 and/or to substantially prevent air from infiltrating the cavity 226). In some embodiments, the seal may be similar to the seal 236. In some embodiments, other sealants, adhesives, fasteners, systems, devices, and/or methods may be used to couple and or seal the end caps 228, 230 to the core 222.

According to some embodiments, the heat exchanger 220 may also or alternatively comprise an element 240 disposed within the cavity 226 of the core 222. The element 240 may, for example, be configured to transport and/or direct the fluid within the cavity 226 of the core 222. The element 240 may also or alternatively facilitate retention of the fluid within the heat exchanger 220 and/or sealing of the cavity 226. In some embodiments, the element 240 may comprise one or more grooves 242 (and/or other features). The grooves 242 may, for example, define one or more channels via which the fluid may be transported and/or directed within the cavity 226 of the core 222. In some embodiments, the grooves 242 may comprise a single groove 242 configured in a substantially spiral pattern on the exterior surface of the element 240. The spiral groove 242 may, for example, define a channel between the exterior surface of the element 240 and the interior surface of the core 222 (e.g., along the surface of the cavity 226 of the core 222).

For example, the exterior surface of the element 240, when inserted into the cavity 226, may contact the interior surface of the core 222. In some embodiments, the areas of the exterior surface of the element 240 that are between the paths of the groove 242 may substantially form seals between the channels created by the groove 242. The fluid entering the cavity 226 may, for example, be forced and/or directed in the space formed between the wall of the core 222 and the groove 242. According to some embodiments, other configurations of the groove 242 and/or the element 240 may be utilized to direct the fluid as desired within the cavity 226. In some embodiments, such as in the case that a spiral groove 242 (and/or resulting channel) is utilized, the configuration of the element 240 and/or the groove 242 may cause the fluid to pass over a large amount of the surface area of the interior wall and/or surface of the core 222. This configuration may, for example, increase the amount of heat transferred from the fluid to the core 222. According to some embodiments, the element 240 may not be needed in the heat exchanger 220. The grooves 242 and/or other fluid direction features may, for example, be included in the extrusion comprising the core 222 and/or the fins 224. In some embodiments, the grooves 224 may be cut and/or otherwise included in the interior wall or surface of the core 222

In some embodiments, the inlet 232 of the second end cap 230 (and/or the first portion 230a thereof) may be oriented to direct fluid into the channel defined by the spiral groove 242. The fluid may proceed, for example, through the channel along the interior surface of the core 222, progressing from the bottom of the cavity 226 (e.g., as oriented in FIG. 2A and FIG. 2B) of the core 222 to the top of the cavity 226 of the core 222 (e.g., in accordance with the spiral channel defined by the spiral groove 242). According to some embodiments, the fluid may transfer heat to the core 222 as it travels through the channel. The groove 242 may be configured, for example, to direct the fluid over a large area of the interior surface of the core 222, to transfer a substantial amount of heat to the core 222 (e.g., via conduction).

The fluid may, for example, be directed by the groove 242 (and/or the channel defined thereby) to scrub a substantial amount of the interior surface of the core 222 to transfer a substantial amount of heat to the core 222. In some embodiments, the element 240 and/or the groove 242 may be configured to adjust the fluid flow properties within the cavity 226 of the core 222. The groove 242 may be designed and/or configured, for example, to establish certain properties of the channel defined by the groove 242. The channel properties may, according to some embodiments, be configured and/or defined to cause the fluid flow to be either laminar or turbulent, as is desirable and/or practicable for transferring heat to the core 222. Turbulent fluid flow within the channel may, for example, increase the convection of heat through and/or within the fluid, thereby increasing the efficiency of heat transfer to the interior walls and/or surface of the core 222.

In some embodiments, the groove 242 may terminate at and/or lead to the upper and/or first end (e.g., as oriented in FIG. 2A and FIG. 2B) of the core 222 and/or of the element 240. The fluid may proceed, for example, from the groove 242 and along the surface of the first end cap 228. In some embodiments, the fluid may be directed through a central portion of the cavity 226 and/or of the element 240 toward the outlet 234. The fluid may, for example, flow through a central conduit 244 extending from the first end of the core 222 and/or the upper end of the element 240 to the lower end of the element 240 and/or to the second end of the core 222. The central conduit 244 may, for example, transport cooled fluid (e.g., fluid that has transferred heat to the core 222) directly from the first end to the outlet 234 at and/or near the second end. The conduit 244 may, for example, substantially prevent the cooled fluid from being re-heated by the heated fluid entering the cavity 226 from the inlet 232 by maintaining a separation between the incoming and outgoing fluid flows. According to some embodiments, the central conduit 244 may be substantially aligned and/or coincident with the axis 204 (as shown).

In some embodiments, the heat exchanger 220 may also or alternatively comprise a fluid path 246 that permits the cooled fluid to enter a reservoir 248 (and/or that permits fluid from within the reservoir 248 to exit the reservoir 248 and enter the central conduit 244). In other words, the fluid path 246 may be hydraulically coupled to the reservoir 248. The reservoir 248 may, for example, be a cavity defined by the element 240. According to some embodiments, the reservoir 248 may be disposed within and/or defined by a vacant and/or void area in the central portion of the element 240. The central conduit 244 may, for example, pass through the reservoir 248. In some embodiments, the reservoir 248 may provide a thermal mass (e.g., air, water, and/or another fluid) to reduce the impact of large and/or severe thermal events. The reservoir 248 may, for example, store a quantity of fluid to supply extra fluid to the heat exchanger 220 in the case that extra fluid is needed and/or to provide thermal dampening as required. According to some embodiments, if fluid leaks from the heat exchanger 220 (e.g., due to old seals 236 and/or O-rings and/or from seepage through hydroscopic plastic elements or components) over the life of the heat exchanger 220, for example, the extra fluid in the reservoir 248 may replenish the lost amounts.

The replacement and/or augmentation of the fluid within the fluid paths of the heat exchanger 220 may, for example, substantially prevent air bubbles from forming and/or being introduced into the fluid flow. In some embodiments, the reservoir 248 may, for example, also or alternatively function as an air trap to collect air bubbles from the fluid flow. The reservoir 248 may, according to some embodiments, comprise one or more inserts and/or bladders (not shown). A foam element (not shown) may, for example, be disposed within the reservoir 248. In some embodiments, the foam element may compress in the case that the fluid in the heat exchanger 220 expands to exert increased forces within the heat exchanger 220. If the fluid expands upon heating and/or due to other environmental factors, for example, the foam may absorb the increased pressure in the heat exchanger 220 to substantially avoid damage to any or all components associated with the fluid flow paths.

The system 200 may also or alternatively comprise a pump 250 comprising a housing 252, a housing inlet 254, and/or a housing outlet 256. The pump 250 may also or alternatively comprise an impeller 260 comprising vanes 262. In some embodiments, the system 200 and/or the pump 250 may comprise a motor 270 comprising one or more electromagnets 272, one or more magnets 274, a rotor 276, and/or one or more bearings 278. According to some embodiments, the system 200 may comprise a combination cold plate 210 and pump 250 (and/or motor 270). The cold plate 210 may, for example, be integrated into the pump 250. In some embodiments, the cold plate 210 may be configured not only to transfer heat to the fluid in the pump 250, but also to facilitate the direction of the fluid inside the pump housing 252.

For example, the central portion 212 of the cold plate 210 may be the hottest portion of the cold plate 210. An electrical component (not shown in FIG. 2A or FIG. 2B) may, for example, transfer more heat to the center of the cold plate 210 than to other portions of the cold plate 210. In some embodiments, the fluid entering the pump 250 via the housing inlet 254 may be initially directed to the central portion 212 of the cold plate 210. The central portion 212 may, as shown in FIG. 2A and FIG. 2B, for example, be extended upward and/or into the fluid path.

The fins 214 of the cold plate 210 may, according to some embodiments, be taller near the central portion 212 of the cold plate, and may decrease in height and/or size as the radius of the cold plate 210 increases. In such a manner, for example, the fluid may be in greater contact with the hottest portions (e.g., the central portion 212) of the cold plate 210, increasing the efficiency of the heat transfer from the cold plate 210 to the fluid. According to some embodiments, the fins 214 and/or the central portion 212 of the cold plate 210 may be configured to direct the fluid in a radial fashion outward from the central portion 212 of the cold plate 210 to the extremities of the cold plate 210. In such a manner, for example, a cross-flow of heat exchange may be accomplished by directing the coldest fluid (e.g., the fluid entering the inlet 254) over the hottest portions (e.g., the central portion 212) of the cold plate 212, while the increasingly heated fluid travels over increasingly cooler portions of the cold plate 210. This cross-flow heat exchange may, according to some embodiments, achieve high efficiencies of heat transfer between the cold plate 210 and the fluid.

In some embodiments, the cold plate 210 may also or alternatively function as a flow inducer for the impeller 260. The fins 214 of the cold plate 210 may, for example, be curved and/or otherwise configured to direct the fluid entering from the housing inlet 254 to the vanes 262 of the impeller 260. The fins 214 may, according to some embodiments, direct the incoming fluid in such a manner so as to increase the efficiency of ingestion of the fluid by the impeller 260. In other words, the direction of the fluid by the fins 214 of the cold plate 210 may reduce friction losses in the fluid flow and/or substantially prevent cavitation and/or other flow disruptions. In some embodiments, the curved nature of the fins 214 may also or alternatively increase the efficiency of heat transfer from the fins 214 to the fluid. The fluid may be scrubbed across the fins 214, for example, as the fluid is forced to change direction by the curved fins 214.

The fins 214 of the cold plate 210 may, according to some embodiments, extend from the central portion 212 of the cold plate 210 to the radius 216 defined by the cold plate 210. The fins 214 may terminate at the radius 216, for example, to provide the surface 218 on the cold plate 210. The surface 218 may, according to some embodiments, provide an area through which the vanes 262 of the impeller 260 may travel. The vanes 262 of the impeller 260 may, for example, travel around the radius 216 of the cold plate 210 (e.g., around the fins 214 and/or on the surface 218). The vanes 262 may, according to some embodiments, direct the fluid received from the fins 214 to the housing outlet 256. In some embodiments, the housing inlet 254 and/or the housing outlet 256 may be defined and/or formed by the pump housing 252. According to some embodiments, the cold plate 210 may be coupled to the pump housing 252. The cold plate 210 may, for example, be coupled to the pump housing 252 to create a hydraulic and/or hermetic seal to substantially prevent the fluid from leaking from the pump housing 252 and/or to substantially prevent air from entering the pump housing 252. In some embodiments, the seal between the cold plate 210 and the pump housing 252 may comprise an O-ring (not shown in FIG. 2A or FIG. 2B) and/or other sealant or fastener.

According to some embodiments, the housing inlet 254 may receive fluid from the outlet 234 of the heat exchanger 220. In some embodiments, the housing inlet 254 may be aligned and/or coincident with the axis 204. The fluid entering the pump 250 may, for example, be directed substantially along the axis 204 by the housing inlet 254. In some embodiments, the housing inlet 254 may penetrate the second end cap 230 of the heat exchanger 220 and/or the reservoir 248. As shown in FIG. 2A and FIG. 2B, for example, the housing inlet 254 may extend along the axis 204 and into the heat exchanger 220. The second end cap 230 (and/or the second portion 230b thereof) may, in some embodiments, be annular in configuration and/or may otherwise define a hole or passage via which the housing inlet 254 may enter to be coupled to the outlet 234 of the heat exchanger 220. In some embodiments, the housing inlet 254 may be coupled to the second end cap 230. According to some embodiments, the coupling of the housing inlet 254 to the second end cap 230 may be augmented with a seal 258. The seal 258 may, for example, be similar to the seal 236 that may be utilized between the portions of the second end cap 230a-b. In some embodiments, the fluid path 246 connecting the central conduit 244 to the reservoir 248 may be included in the housing inlet 254. The housing inlet 254 may, for example comprise one or more holes, voids, passages, and/or other paths that may function as the fluid path 246. According to some embodiments, the fluid path 246 may also or alternatively be included in the central conduit 244. In some embodiments, the housing 252 and the core 222 of the heat exchanger 220 may be integrated and/or may otherwise comprise the same device and/or component.

In some embodiments, the system 200 may also or alternatively comprise the motor 270. The motor 270 may, for example, power the impeller 260 to direct the fluid toward the housing outlet 256. According to some embodiments, any type and/or configuration of motor that is or becomes known may be utilized to provide power to the impeller 260. As shown in FIG. 2A and FIG. 2B, for example, the motor 270 may be or include a brushless motor such as a brushless direct current (DC) motor. The motor 270 may comprise, for example, one or more electromagnets 272 (and/or electromagnetic coils), one or more magnets 274 (e.g., permanent magnets), and/or a rotor 276. In some embodiments, the magnets 274 may be coupled to the rotor 276 (e.g., as is typical in brushless DC motors). According to some embodiments, one or more bearings 278 may be utilized to reduce friction and/or facilitate motion of the rotor 276.

As shown in FIG. 2A and FIG. 2B, the motor 270 may be integrated into the pump 250. The rotor 276 (and the magnets 274 coupled thereto) may, for example, rotate within the pump housing 252. In some embodiments, the rotor 276 may also or alternatively rotate about the axis 204. The bearings 278 may, according to some embodiments, facilitate the rotation of the rotor 276 within the pump housing 252. In some embodiments, some of the components 272, 274, 276 of the motor 270 may be separated by a wall of the pump housing 252. As shown in FIG. 2A and FIG. 2B, for example, the rotor 276 and the magnets 274 may be disposed within the pump housing 252 (e.g., exposed to the fluid), while the electromagnets 272 may be disposed and/or coupled to the outside of the pump housing 252 (e.g., not exposed to the fluid). The magnetic and/or electromagnetic forces required to operate the motor 270 may, for example, pass through the wall of the pump housing 252 to permit the motor 270 to be integrated into the pump 250.

In some embodiments, integrating the motor 270 into the pump 250 may eliminate the need for a shaft (e.g., to power the impeller) and/or may eliminate the need for dynamic hydraulic and/or hermetic seals (e.g., that would typically be required surrounding a powered shaft protruding from the pump housing 252). The impeller 260 may, for example, be disposed upon and/or coupled to the rotor 276. As shown in FIG. 2A and FIG. 2B, for example, the vanes 262 of the impeller 260 may be disposed on the bottom portion of the rotor 276 that rotates over the surface 218 of the cold plate 210. According to some embodiments, integrating the motor 270 into the pump 250 may reduce the potential for wear, leaking, and/or other problems associated with the pump 250.

The only non-fluid path seal that may be required in the system 200, for example, may be the seal between the cold plate 210 and the pump housing 252. The integrated motor 270 may be brushless and/or may not require a shaft penetrating the pump housing 252. Incorporating the rotor 276 and/or the magnets 274 into the fluid within the pump housing 252 may also or alternatively, according to some embodiments, create a hydroscopic bearing effect that may reduce the wear on various system 200 components (such as the bearings 278, the rotor 276, and/or the pump housing 252 itself). In some embodiments, the integrated motor 270 may also or alternatively allow the diameter of the impeller 260 and/or rotor 276 to be larger than in typical pumps and/or motors. The larger diameter impeller 260 and/or rotor 276 may, for example, allow the motor to spin at lower revolutions per minute (RPM) than typical motors, while producing higher torque, flow, and/or pressure.

In some embodiments, the system 200 may provide many advantages over typical cooling solutions. The integration and/or coaxial orientation of multiple components (e.g., the heat exchanger 220, the pump 250, the cold plate 210, and/or the motor 270) and/or the configuration that closely couples the heat exchanger 220 to the pump 250 may, for example, substantially reduce the space required for the cooling system 200, may substantially reduce the length of the fluid path, and/or may otherwise increase the efficiency of the system 200. In other words, the alignment of the heat exchanger 220 along the axis 204 and/or the disposition of the impeller 260 to spin about the axis 204 may, for example, substantially reduce the length of the path required for fluid travel and/or may substantially reduce friction losses associated with the fluid path. The coaxial orientation of the system 200 may not only reduce cooling solution space, but may also increase system 200 efficiency by reducing friction losses in the fluid path, reducing the length and/or size of the fluid path (e.g., requiring less fluid volume), and/or reduce the possibility for fluid leakage (e.g., due to reduction of dynamic seals and/or due to reducing the wetted area of components through which the fluid may seep). Typical systems include much longer fluid path lengths in contact with externally exposed plastic areas. No hoses and/or tubes may be necessary in the cooling system 200, for example.

Figure 3:
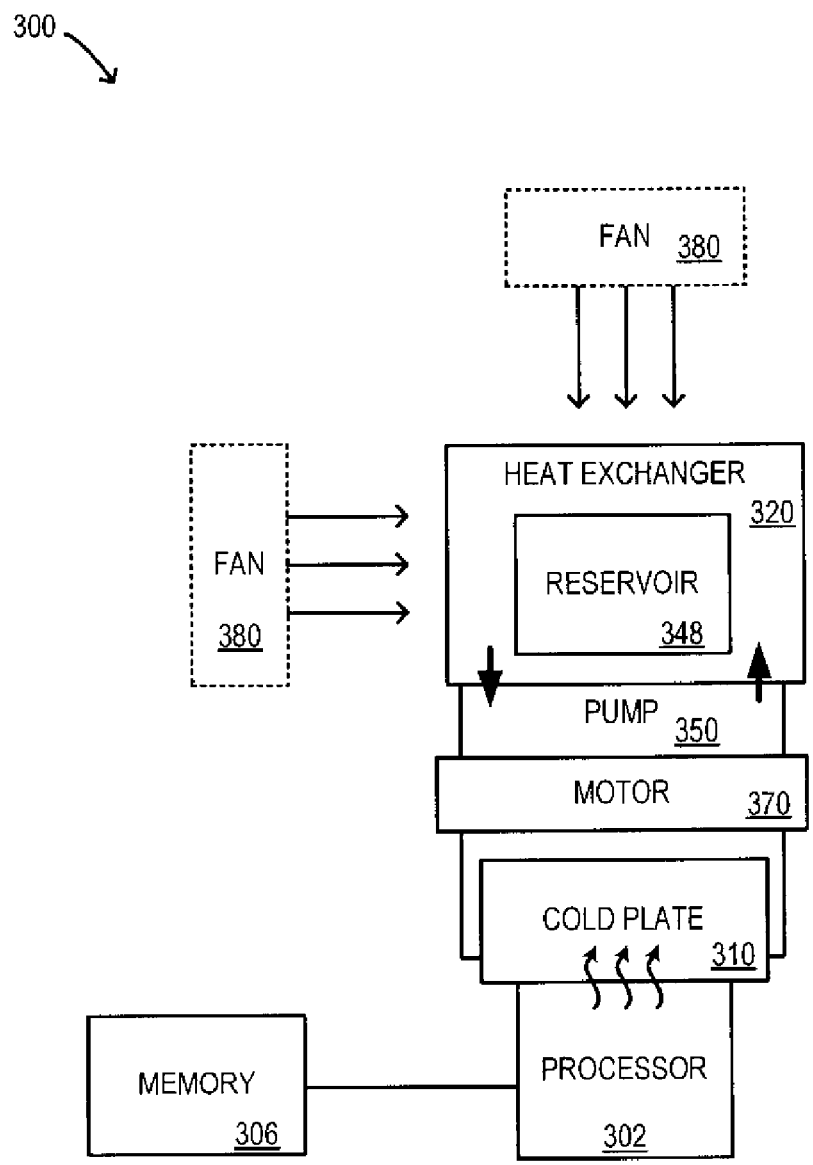
FIG. 3 is a block diagram of a system according to some embodiments.

Turning to FIG. 3, a block diagram of a system 300 according to some embodiments is shown. In some embodiments, the system 300 may be similar to the systems 100, 200 described in conjunction with any of FIG. 1, FIG. 2A, and/or FIG. 2B. The system 300 may comprise, for example, a processor 302, a memory 306, a cold plate 310, a heat exchanger 320, a reservoir 348, a pump 350, a motor 370, and/or a fan 380. According to some embodiments, the components 302, 310, 320, 348, 350, 370, 380 of the system 300 may be similar in configuration and/or functionality to the similarly-named components described in conjunction with any of FIG. 1, FIG. 2A, and/or FIG. 2B. In some embodiments, fewer or more components than are shown in FIG. 3 may be included in the system 300.

The processor 302 may be or include any number of processors, which may be any type or configuration of processor, microprocessor, and/or micro-engine that is or becomes known or available. In some embodiments, other electronic and/or electrical devices may be utilized in place of or in addition to the processor 302. The processor 302 may, for example, be or include any device, object, and/or component that generates, stores, and/or requires removal of heat. According to some embodiments, the processor 302 may be an XScale® Processor such as an Intel® PXA270 XScale® processor. The memory 306 may be or include, according to some embodiments, one or more magnetic storage devices, such as hard disks, one or more optical storage devices, and/or solid state storage. The memory 306 may store, for example, applications, programs, procedures, and/or modules that store instructions to be executed by the processor 302. The memory 306 may comprise, according to some embodiments, any type of memory for storing data, such as a single data rate random access memory (SDR-RAM), a double data rate random access memory (DDR-RAM), or a programmable read only memory (PROM).

In some embodiments, the cold plate 310 may be or include an IHS coupled to the processor 302. The cold plate 310 may, for example, remove and/or receive heat (e.g., via conduction) from the processor 302 (e.g., represented by the wavy lines in FIG. 3). According to some embodiments, such as shown in FIG. 3 for example, the cold plate 310 may be integrated with the pump 350. The cold plate 310 may, for example, transfer heat to a fluid in the pump 350 and/or facilitate the flow of the fluid within the pump 350 as described herein. In some embodiments, the motor 370 may also or alternatively be integrated with the pump 350. The motor 370 may, for example, include components disposed within the pump 350 and/or components disposed outside of the pump 350. In some embodiments, the motor 370 may power the pump 350 to direct the fluid (e.g., the heated fluid) to the heat exchanger 320. The heat exchanger 320 may then, for example, transfer and/or receive heat from the fluid and dissipate and/or remove the heat from and/or within the system 300. The fan 380 may, in some embodiments, facilitate the removal and/or dissipation of heat by blowing air toward the heat exchanger 320. In some embodiments, the fan 380 may be disposed and/or configured to direct air toward the heat exchanger 320 from one or more of various locations (e.g., as shown in FIG. 3). According to some embodiments, the reservoir 348 to store the fluid (and/or a portion thereof) may be integrated with the heat exchanger 320. The fluid (e.g., the cooled fluid) may, for example, be directed from the heat exchanger 320 into the reservoir 348. According to some embodiments, the cooled fluid may be sent back to the pump 350 (and/or pump 350, motor 370, cold plate 310 combination) to continue the cooling cycle.

In some embodiments, any or all of the cooling components 310, 320, 348, 350, 370, 380 may be or include components similar to those described herein. According to some embodiments, one or all of the cooling components 310, 320, 348, 350, 370, 380 may also or alternatively comprise one or more conventional devices to perform the required functionality of the particular component. As an example, the heat exchanger 320 may, in some embodiments, be a typical heat sink and/or heat pipe. The pump 350 may also or alternatively, for example, be a typical centrifugal pump powered by a standard DC motor (e.g., coupled by a shaft to the pump 350).

According to some embodiments, two or more of the components 302, 310, 320, 348, 350, 370, 380 of the system 300 may be oriented inline and/or otherwise closely coupled (e.g., along an axis such as the axis 204). The processor 302, the cold plate 310, the pump 350 (and/or motor 370), and/or the heat exchanger 320 (and/or the reservoir 348) may, for example, be oriented and/or coupled in a substantially linear configuration. In some embodiments, the heat exchanger 320 may extend between first and second ends disposed along the axis 204 and/or the an impeller of the pump 350 may be disposed to spin about the axis 204. Such a configuration may, for example, reduce the amount of space required for the system 300, reduce the length of the fluid travel path within the system 300, reduce and/or eliminate the need for dynamic seals, and/or reduce and/or eliminate the need for external piping, tubing, and/or other fluid management components. According to some embodiments, the obstruction to airflow within the system 300 may be reduced by the configuration that places the fluid management, cooling, and/or other components (302, 310, 320, 348, 350, 370, 380) in the shadow of the hub of the fan 380. In other words, the coaxial and/or inline components 302, 310, 320, 348, 350, 370, 380 of the system 300 may be positioned behind a central portion of the fan 380 (which may typically be the fan hub) which produces minimal or no airflow. In the case that the components 302, 310, 320, 348, 350, 370, 380 of the cooling system are configured as describe in some embodiments herein (e.g., utilizing a coaxial orientation), the cooling system may also or alternatively be substantially lighter and/or cheaper to manufacture than typical cooling solutions.

The several embodiments described herein are solely for the purpose of illustration. Other embodiments may be practiced with modifications and alterations limited only by the claims.

What is claimed is:

1. A method comprising:
    accepting a fluid at an inlet of a heat exchanger that comprises a core and a plurality of fins, wherein the core has a first end and a second end, wherein the ends are disposed along an axis, wherein the core defines a cavity extending between the first and second ends and wherein the plurality of fins extend outwardly from the core between the first and second ends;
    directing the fluid within the cavity using an element disposed within the cavity;
    evacuating the fluid at an outlet of the heat exchanger and along the axis at the second end;

receiving, at an inlet of a pump housing, the fluid from the outlet of the heat exchanger;

moving the fluid toward an outlet of the pump housing using an impeller that is (i) disposed within the pump housing and (ii) disposed to spin about the axis;

evacuating the fluid from the outlet of the pump housing to the inlet of the heat exchanger;

powering the impeller using a motor; and providing a cold plate disposed at least partially within the pump housing.

2. The method of claim 1, wherein the pump housing and the heat exchanger core are integrated.

3. The method of claim 1, wherein at least one of the core or the element define one or more channels to direct the fluid within the cavity.

4. The method of claim 1, wherein directing the fluid within the cavity using an element disposed within the cavity comprises:

directing the fluid within the cavity using an element that comprises an exterior surface that (i) contacts an interior surface of the cavity, and (ii) comprises at least one groove.

5. The method of claim 4, wherein directing the fluid within the cavity using an element that comprises an exterior surface comprises:

directing the fluid within the cavity using at least one channel that is (i) defined by the at least one groove of the exterior surface and (ii) disposed between the exterior surface of the element and the interior surface of the cavity.

6. The method of claim 4, wherein directing the fluid within the cavity using an element that comprises an exterior surface comprises:

directing the fluid within the cavity using at least one channel that is (i) defined by the at least one groove of the exterior surface, (ii) disposed between the exterior surface of the element and the interior surface of the cavity and (iii) oriented in a substantially spiral configuration.

7. The method of claim 1, further comprising:

storing a quantity of the fluid in a reservoir disposed within a central portion of the cavity.

8. The method of claim 7, wherein storing a quantity of the fluid in a reservoir disposed within a central portion of the cavity comprises:

storing a quantity of the fluid in a reservoir disposed within a central portion of the cavity and defined by the element.

9. The method of claim 7, further comprising hydraulically coupling the reservoir to a path extending along the axis through the central portion of the cavity.

10. The method of claim 1, wherein powering the impeller using a motor comprises:

powering the impeller using a motor that comprises (i) a rotor (ii) at least two magnets disposed within the pump housing and (iii) at least two electromagnetic coils disposed outside of the pump housing.

11. The method of claim 10, wherein the impeller is disposed on at least one portion of the rotor.

12. The method of claim 11, wherein accepting a fluid comprises:

accepting the fluid substantially along the axis.

* * * * *